United States Patent
Yaung

(10) Patent No.: US 7,429,496 B2
(45) Date of Patent: Sep. 30, 2008

(54) BURIED PHOTODIODE FOR IMAGE SENSOR WITH SHALLOW TRENCH ISOLATION TECHNOLOGY

(75) Inventor: Dun-Nian Yaung, Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 462 days.

(21) Appl. No.: 11/215,288

(22) Filed: Aug. 30, 2005

(65) Prior Publication Data

US 2007/0045794 A1  Mar. 1, 2007

(51) Int. Cl.
*H01L 21/00* (2006.01)
*H01L 31/062* (2006.01)

(52) U.S. Cl. .............. 438/57; 257/292; 257/E21.628; 257/E31.032; 438/546

(58) Field of Classification Search .............. 438/42, 438/57, 546, 45; 257/519, 292, 332, E21.628, 257/E21.635, E21.642, E31.032, E31.084, 257/E31.085, E21.135
See application file for complete search history.

(56) References Cited

U.S. PATENT DOCUMENTS

| | | | |
|---|---|---|---|
| 5,625,210 A | 4/1997 | Lee et al. ............ | 257/292 |
| 6,410,359 B2 | 6/2002 | Connolly et al. ........ | 438/48 |
| 6,486,521 B2 | 11/2002 | Zhao et al. ........... | 257/443 |
| 2005/0042793 A1* | 2/2005 | Mouli et al. .......... | 438/57 |
| 2006/0124976 A1* | 6/2006 | Adkisson et al. ....... | 257/292 |

FOREIGN PATENT DOCUMENTS

WO  WO2004044989  5/2004

OTHER PUBLICATIONS

"A 0.6 µm CMOS Pinned Photodiode Color Imager Technology" Guidash et al., 1997.
Taiwan Office Action mailed Sep. 21, 2006.

* cited by examiner

*Primary Examiner*—Caridad M Everhart
(74) *Attorney, Agent, or Firm*—Thomas, Kayden, Horstemeyer & Risley

(57) ABSTRACT

A buried photodiode with shallow trench isolation technology is formed in a semiconductor substrate of a first conductive type. A trench having a bottom portion and a sidewall portion is formed in the semiconductor substrate. An isolation region is formed on the bottom portion of the trench. A gate structure covers the sidewall portion of the trench. A first doped region of a second conductive type is formed in the semiconductor substrate adjacent to the trench and the gate structure. A second doped region of the first conductive type is formed overlying the first doped region near the surface of the semiconductor substrate.

19 Claims, 3 Drawing Sheets

BURIED PHOTODIODE FOR IMAGE SENSOR WITH SHALLOW TRENCH ISOLATION TECHNOLOGY

TECHNICAL FIELD

The present invention relates to an image sensor, and particularly to a buried photodiode for an image sensor with shallow trench isolation technology.

BACKGROUND

CMOS (Complementary Metal Oxide Semiconductor) image sensors have become the dominant solid state imaging technology due to their lower cost, superior performance, and higher resolution than CCD (charge coupled device) imager. In addition, signal processing logic can be integrated alongside the imaging circuitry, thus allowing for a single integrated chip to form a complete stand alone imaging device. The most popular active pixel sensor structure consists of three or four transistors and an $N^+/P^-$ well photodiode, but has the drawback of a relatively large dark current. The dark current decreases signal-to-noise ratios for the image sensor and decreases image quality. Another active pixel sensor design is pinned photodiode (PPD) which would be called "buried photodiode" since it has PNP (or NPN) junction structure which is buried in a substrate near the silicon surface. The pinned photodiode structure can increase the depletion depth to bring about high quantum efficiency in converting incident photons into electric charges, and has gained favor for its ability to have good color response for blue light, as well as advantages in dark current density.

The pinned photodiode structure, however, is not compatible with shallow trench isolation (STI) technology because it is difficult to control shallow junction at the STI sidewall. The trenches used for trench isolation are generally dry etched and, as a result, the trench surfaces usually have a large number of interface states, which lead to high surface generation velocity and a large dark current. The trench forming processes also cause crystalline defects (such as dislocations and stacking faults), which reduce carrier generation lifetime and increase dark current. The sidewalls and bottom portion of the STI structure have a higher silicon density than the substrate, creating a higher density of trap sites that are areas in the silicon dioxide/silicon interface and trap electrons or holes. In a conventional trench-isolated photodiode, a buffer of P-well region is provided between the STI structure and the diffusion region that forms the PN junction of the photodiode. This design only lowers trap sites at the interface near the silicon surface, but fails in solving the high-density trap sites at the STI sidewall. Accordingly, it is desirable to provide a pinned photodiode with STI technique for reducing dark current caused by higher trap sites along the STI sidewall.

SUMMARY OF THE INVENTION

Embodiments of the present invention include buried photodiodes with STI technology and fabrication methods thereof for reducing dark current caused by higher trap sites along the STI sidewall.

In one aspect, the present invention provides a semiconductor device comprising: a semiconductor substrate of a first conductive type; at least one trench having a bottom portion and a sidewall portion formed in the semiconductor substrate; an isolation region formed on the bottom portion of the trench; a gate structure covering the sidewall portion of the trench; a first doped region of a second conductive type formed in the semiconductor substrate adjacent to the trench and the gate structure; and a second doped region of the first conductive type formed overlying the first doped region near the surface of the semiconductor substrate.

In another aspect, the present invention provides a method of forming a semiconductor device, comprising: providing a semiconductor substrate of a first conductive type; forming a trench comprising a sidewall portion and a bottom portion in the semiconductor substrate; filling the trench with a dielectric material to form an isolation structure; forming a first doped region of a second conductive type in the semiconductor substrate adjacent to the isolation structure; forming a recess in the isolation structure to expose at least part of the sidewall portion of the trench; at least part of the isolation structure remaining on the bottom portion of the trench; and forming a gate structure along the exposed sidewall portion of the trench.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
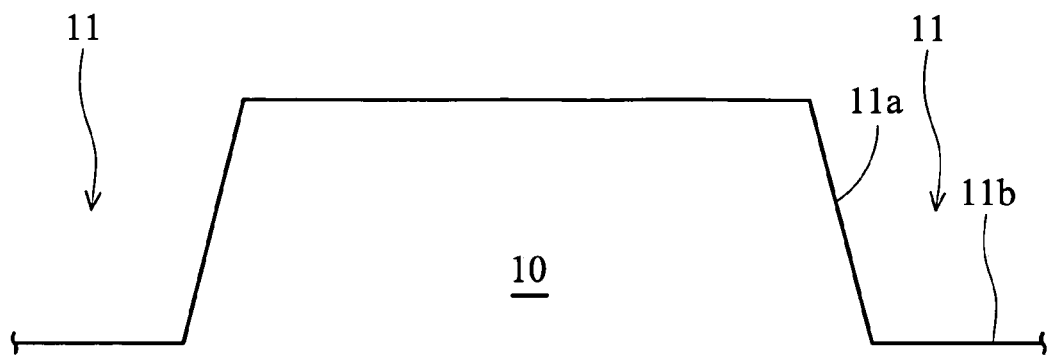
FIG. 1 to FIG. 6 are cross-sectional diagrams illustrating an exemplary embodiment of a process fabricating a buried photodiode with a MOS capacitor structure along a STI sidewall.

Preferred embodiments of the present invention provide buried photodiodes for image sensors with STI technology and fabrication methods thereof. The inventive pixel cell of an image sensor comprises a buried photodiode structure, a STI structure and a MOS capacitor structure. The buried photodiode has PN (or NP) junction structure buried in a substrate near the silicon surface, which reduces dark signal and improves color response for short-wavelength light (e.g., blue light). The MOS capacitor structure is fabricated along the STI sidewall to cover high-density trap sites at the STI sidewall, thereby further reducing dark signal. The inventive fabrication method can combine with 1TQ (1T-SRAM) process to realize camera1-on-chip technology.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, cross-sectional diagrams of FIG. 1 to FIG. 6 illustrate an exemplary embodiment of a buried photodiode process for forming a MOS capacitor structure along STI sidewall.

Figure 2:
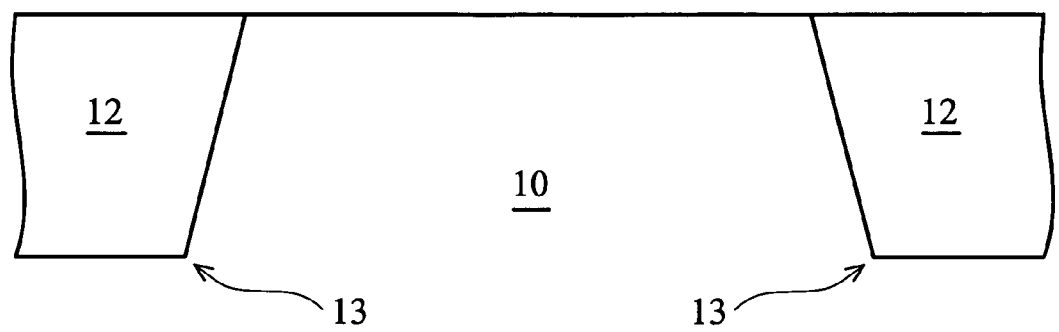

In FIG. 1, a semiconductor substrate 10 of a first conductive type is provided with at least one trench 11 for forming an isolation region and a MOS capacitor structure therein during subsequent processes. In one embodiment, the semiconductor substrate 10, in one pixel cell, may comprise two trenches 11. The trench 11 consists of a sidewall portion 11a and a bottom portion 11b. Then the trenches 11 are filled with a dielectric material 12, forming shallow trench isolation (STI) structures 13 as shown in FIG. 2.

For exemplary purposes the semiconductor substrate 10 may be a silicon substrate slightly doped with a dopant of p-type. The invention also has application to other semiconductor substrates, for example a substrate including an elementary semiconductor such as silicon, germanium, and diamond, or a compound semiconductor such as silicon carbide, gallium arsenic, indium arsenide, and indium phosphide. The semiconductor substrate 10 may include an epitaxial layer overlying a bulk semiconductor, a silicon germanium layer overlying a bulk silicon, a silicon layer overlying a bulk silicon germanium, or a semiconductor-on-insulator (SOI) structure. While the present invention is illustrated in connection with a photodiode in a p-type semiconductor structure, opposite conductivity type devices could be used by inverting the conductivity types of the semiconductor substrate 10 and a photodiode region.

Figure 3:
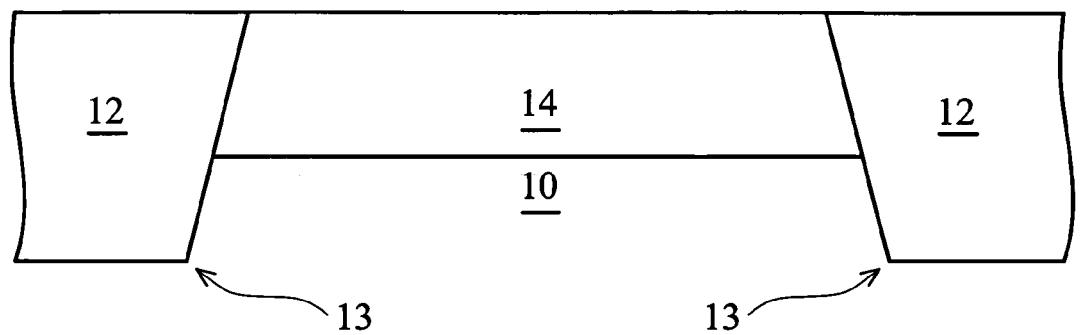

The STI structures 13 may be created with conventional approaches, including, but not limited to, steps of etching trenches into the substrate, depositing dielectric materials into the trenches, polishing off the excess isolating materials, and planarizing the trenches for the next level of fabrication. The dielectric material layer 12 may be an oxide material (for example silicon oxide), an oxynitride material, a nitride material (such as silicon nitride), silicon carbide, other suitable dielectric material, or combinations thereof. The depth of the STI structure 13 may be within the range of approximately 2500 Angstroms to 10000 Angstroms;

Referring to FIG. 3, a photodiode region 14 of a second conductivity type is then formed in the semiconductor substrate 10 between the STI structures 13. The photodiode region 14 may be formed above a level of the bottom portion 11b of the trench 11. Preferably the photodiode region 14 is a lightly doped N⁻ region. The N⁻ region may be formed by methods known in the art. For example, a mask of photoresist (not shown) having an opening over the surface where the N⁻ region is patterned over the substrate. An N-type dopant, such as phosphorus, arsenic, or antimony is implanted through the opening and into the semiconductor substrate 10. The N⁻ region forms a photosensitive charge accumulating region for collecting photo-generated electrons. The implant dose in the N⁻ region is within the range of approximately $5 \times 10^{11}$ to $1 \times 10^{14}$ atoms/cm².

Figure 4:
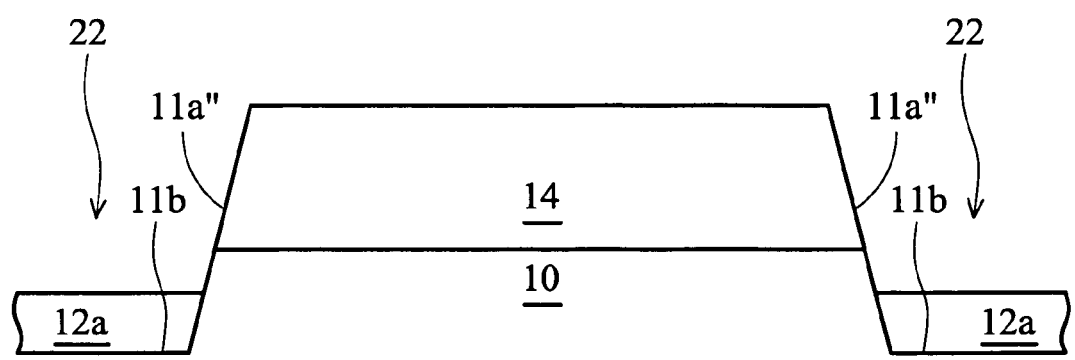

In FIG. 4, after the formation of the STI structures 13 and the photodiode region 14, a part of the dielectric material layer 12 filled in the trench 11 is removed to form a recess 16 that exposes a part of the sidewall portion 11a" around the photodiode region 14, while at least part of the dielectric material layer 12 remains on the bottom portion 11b to serve as an isolation region 12a in the trench 11. A mask level is used for patterning, and the exposed sidewall portion 11a" is formed in the semiconductor substrate 10 where a gate structure of a MOS capacitor structure is to be formed. The recess 16 may be formed through a wet etching process to reach a depth within the range of approximately 1500 Angstroms to 9000 Angstroms. The top surface of the isolation region 12a may be formed lower than a level of the bottom surface of the photodiode region 14.

Figure 5:
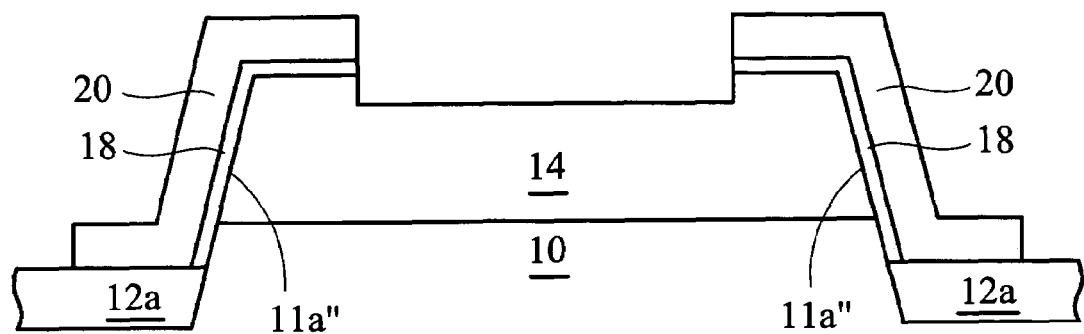

In FIG. 5, through advances in deposition, lithography and masking techniques and dry etching processes, a gate structure of a MOS capacitor structure is formed over the semiconductor substrate 10 and along the exposed sidewall portion 11a" of the trench 11. The gate structure includes a gate dielectric layer 18 and a gate conductive layer 20 stacked thereon. The gate dielectric layer 18 is deposited over the semiconductor substrate 10 and patterned on the exposed sidewall portion 11a". Also, the gate dielectric layer 18 may extend to a portion of the top surface of the photodiode region 14 adjacent to the recess 16. The gate conductive layer 20 is deposited and patterned over the gate dielectric layer 18 to cover the exposed sidewall portion 11a". Also, the gate conductive layer 20 may extend to cover a portion of the top surface of the photodiode region 14 around the recess 16 and a portion of the isolation region 12a. The patterning step for the gate structure may be accomplished using photolithography and etching to transfer the pattern defined by a photomask to the gate conductive layer 20 and the gate dielectric layer 18. The photolithography process may include photoresist coating, soft baking, mask aligning, exposing, post-exposure baking, developing photoresist, hard baking, and photoresist stripping. The etching process may include wet etch, dry etch, ion-reactive-etch (RIE), and other suitable processing. A cleaning process may be followed after patterning the gate structure.

In one embodiment, the gate dielectric layer 18 is a silicon oxide layer with a thickness chosen specifically for the scaling requirements of the MOSFET device technology, for example, formed through a thermal oxidation process, a chemical vapor deposition (CVD) process, atomic layer deposition (ALD), or other advanced methods. It is to be appreciated other well-known gate dielectric material such as oxides, nitrides, high-k materials, and combinations thereof. In one embodiment, the gate conductive layer 20 is a polysilicon layer with a gate length chosen specifically for the scaling requirements of the MOSFET device technology, for example deposited through Low Pressure CVD (LPCVD) methods, CVD methods and Physical Vapor Deposition (PVD) sputtering methods employing suitable silicon source materials. If desired the polysilicon layer may be ion implanted to the desired conductive type. It is to be appreciated other well-known gate electrode material such as metal, metal alloys, single crystalline silicon, or any combinations thereof.

Figure 6:
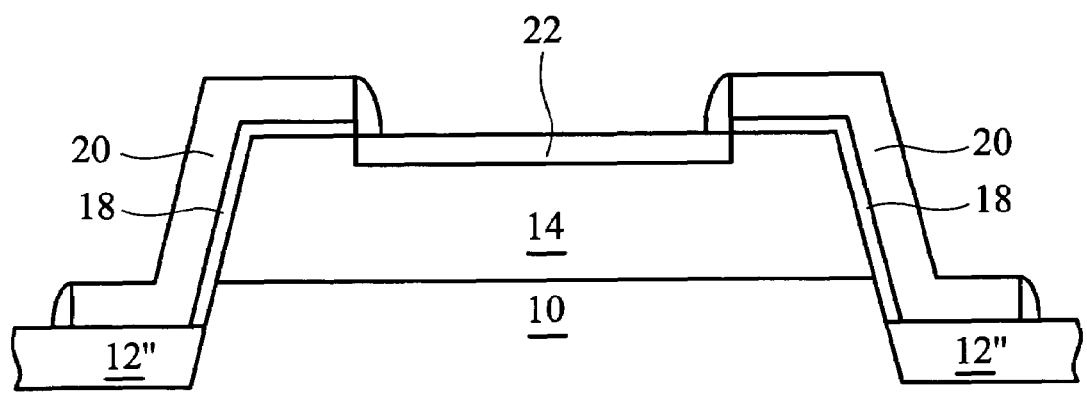

In FIG. 6, after forming the MOS capacitor structure, a pinned surface layer 22 of the first conductivity type is formed overlying the photodiode region 14, for example on the exposed surface area of the photodiode region 14. Preferably, the pinned surface layer 22 is a highly doped P⁺-type pinning region 22 within the range of approximately 200 Angstroms to 2000 Angstroms deep. The P⁺-type pinning region 22 is adjacent to the gate structure and spaced away from the gate conductive layer 20 by the gate dielectric layer 18. For example, the implant dose of the P⁺-type pinning region 22 is within the range of approximately $1 \times 10^{12}$ to $3 \times 10^{14}$ atoms/cm². The P⁺-type pinning region 22 may be formed using any P-type dopant such as boron, indium, or other suitable p-type ions. The potential in the photodiode is pinned to a constant value when the photodiode is fully depleted. The electron capacity of pinned photodiodes typically depends on the doping level of the image sensor and the dopants implanted into the active layer. This P-N-P structure is formed as a pinned photodiode within the semiconductor substrate 10. While the embodiment is directed to a P-N-P pinned photodiode structure, the embodiments also are applicable to an N-P-N pinned photodiode structure.

Thereafter, dielectric spacers may be formed on the sidewalls of the gate conductive layer. Additionally, a silicide layer (not shown) may be optionally formed over the gate conductive layer. The silicide layer may be included in all of the gate structures in an imager circuit and may be titanium silicide, tungsten silicide, cobalt silicide, molybdenum silicide, or tantalum silicide. Subsequently, the pixel cell may be further processed to form other conventional features of a pixel cell, such as inter-layer-dielectric (ILD) deposition.

Compared with the conventional pixel cell for an image sensor, the inventive pixel cell employs a gate structure of a MOS capacitor structure to cover high-density trap sites at the STI sidewall, thereby reducing dark signal and improving color response of short-wavelength light (e.g., blue light). This design can control the shallow junction at the STI sidewall to make the pinned photodiode structure more compatible with STI technology.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A semiconductor device, comprising:
   a semiconductor substrate of a first conductive type comprising at least one trench, wherein said trench comprising a bottom portion and a sidewall portion;
   an isolation region formed on said bottom portion of said trench;
   a gate structure covering said sidewall portion of said trench, wherein the gate structure comprises a gate dielectric layer and a gate conductive layer formed on the gate dielectric layer, wherein gate dielectric layer is distinct from the isolation region;
   a first doped region of a second conductive type formed in said semiconductor substrate adjacent to said trench and said gate structure; and
   a second doped region of said first conductive type formed overlying said first doped region near the surface of said semiconductor substrate.

2. The semiconductor device of claim 1, wherein said gate structure extends to cover at least part of said isolation region.

3. The semiconductor device of claim 1, wherein said first conductive type is P, and said second conductive type is N.

4. The semiconductor device of claim 1, wherein a concentration of said first conductivity type in said second doped region is greater than a concentration of the first conductive type in said semiconductor substrate.

5. The semiconductor device of claim 1, wherein said gate dielectric layer is an oxide layer.

6. The semiconductor device of claim 1, wherein said gate conductive layer is a polysilicon layer.

7. The semiconductor device of claim 1, wherein said gate structure covers said first doped region around said sidewall portion of said trench.

8. The semiconductor device of claim 1, wherein said gate structure extends to cover at least part of the top surface of said first doped region.

9. The semiconductor device of claim 8, wherein said second doped region is formed on the surface of the said first doped region adjacent to said gate structure.

10. A method of forming a semiconductor device, comprising:
    providing a semiconductor substrate of a first conductive type;
    forming a trench comprising a sidewall portion and a bottom portion in said semiconductor substrate;
    filling said trench with a dielectric material to form an isolation structure;
    forming a first doped region of a second conductive type in said semiconductor substrate adjacent to said isolation structure;
    forming a recess in said isolation structure to expose at least part of said sidewall portion of said trench, wherein at least part of said isolation structure remains on said bottom portion of said trench; and
    forming a gate structure along said exposed sidewall portion of said trench.

11. The method of claim 10, wherein said gate structure extends to cover at least part of said isolation structure remaining on said bottom portion of said trench.

12. The method of claim 10, wherein said first conductive type is P, and said second conductive type is N.

13. The method of claim 10, wherein a concentration of said first conductivity type in said second doped region is greater than a concentration of the first conductive type in said semiconductor substrate.

14. The method of claim 10, wherein said gate structure comprises a gate dielectric layer and a gate conductive layer formed on said gate dielectric layer.

15. The method of claim 10, wherein said gate dielectric layer is an oxide layer.

16. The method of claim 10, wherein said gate conductive layer is a polysilicon layer.

17. The method of claim 10, further comprising forming a second doped region of said first conductivity type overlying said first doped region near the surface of said semiconductor substrate.

18. The method of claim 17, wherein said gate structure extends to cover at least part of the top surface of said first doped region.

19. The method of claim 18, wherein said second doped region is formed on the exposed surface of said first doped region and adjacent to said gate structure.

* * * * *